(12) United States Patent
Bailey et al.

(10) Patent No.: US 6,921,962 B1
(45) Date of Patent: Jul. 26, 2005

(54) INTEGRATED CIRCUIT HAVING A THIN FILM RESISTOR LOCATED WITHIN A MULTILEVEL DIELECTRIC BETWEEN AN UPPER AND LOWER METAL INTERCONNECT LAYER

(75) Inventors: Fred D. Bailey, Irving, TX (US); Stuart M. Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/452,691

(22) Filed: Dec. 2, 1999

Related U.S. Application Data

(60) Provisional application No. 60/112,731, filed on Dec. 18, 1998.

(51) Int. Cl.7 ............... H01L 29/74; H01L 31/111; H01L 23/62; H01L 29/00; H01L 27/102
(52) U.S. Cl. ............... 257/537; 257/154; 257/359; 257/380; 257/381; 257/577
(58) Field of Search .................. 257/154, 359, 257/380, 381, 516, 577, 536–537, 543, 538, 257/373, 358

(56) References Cited

U.S. PATENT DOCUMENTS

| | | | | |
|---|---|---|---|---|
| 4,755,480 A | * | 7/1988 | Yau et al. | 438/384 |
| 4,902,637 A | * | 2/1990 | Kondou et al. | 438/152 |
| 4,905,078 A | * | 2/1990 | Sagara et al. | 257/73 |
| 5,112,765 A | * | 5/1992 | Cederbaum et al. | 438/152 |
| 5,241,206 A | * | 8/1993 | Lee et al. | 257/380 |
| 5,275,963 A | * | 1/1994 | Cederbaum et al. | 438/624 |
| 5,296,726 A | * | 3/1994 | MacElwee | 257/213 |
| 5,352,923 A | * | 10/1994 | Boyd et al. | 257/536 |
| 5,420,063 A | | 5/1995 | Maghsoudnia et al. | 437/60 |
| 5,541,442 A | * | 7/1996 | Keil et al. | 257/533 |
| 5,547,896 A | | 8/1996 | Linn et al. | 437/60 |
| 5,625,215 A | * | 4/1997 | Chen et al. | 257/379 |
| 5,652,460 A | * | 7/1997 | Kalb et al. | 257/536 |
| 5,751,050 A | * | 5/1998 | Ishikawa et al. | 257/538 |
| 5,874,770 A | * | 2/1999 | Saia et al. | 257/536 |
| 5,923,077 A | * | 7/1999 | Chase et al. | 257/536 |
| 5,994,759 A | * | 11/1999 | Darmawan et al. | 257/538 |
| 6,081,014 A | * | 6/2000 | Redford et al. | 257/359 |
| 6,150,228 A | * | 11/2000 | Horiba | 438/384 |
| 6,208,009 B1 | * | 3/2001 | Kravtchenko et al. | 257/533 |
| 6,459,562 B1 | * | 10/2002 | KarRoy et al. | 361/312 |
| 6,627,971 B1 | * | 9/2003 | Shen et al. | 257/538 |

* cited by examiner

*Primary Examiner*—Tom Thomas
*Assistant Examiner*—Jesse A. Fenty
(74) *Attorney, Agent, or Firm*—Jacqueline J. Garner; W. James Brady, III; Frederick J. Telecky, Jr.

(57) ABSTRACT

A thin film resistor (60) is contained between two metal interconnect layers (40, 100) of an integrated circuit. Contact may be made to the resistor (60) through vias (95) from the metal layer (100) above the resistor (60) to both the thin film resistor (60) and the underlying metal layer (40) simultaneously. The resistor (60) may include portions of a hard mask (70) under the vias (95) to protect the resistor material (60) during the via (95) etch. This design provides increased flexibility in fabricating the resistor (60) since processes, materials, and chemicals do not have to satisfy the conditions of both the resistor (60) and the rest of the integrated circuit (especially the interconnect layer 40) simultaneously.

7 Claims, 2 Drawing Sheets

INTEGRATED CIRCUIT HAVING A THIN FILM RESISTOR LOCATED WITHIN A MULTILEVEL DIELECTRIC BETWEEN AN UPPER AND LOWER METAL INTERCONNECT LAYER

This application claims priority under 35 USC 119(e)(1) of provisional application No. 60/112,731 filed Dec. 18, 1998.

FIELD OF THE INVENTION

The invention is generally related to the field of integrated circuits and more specifically to thin film resistors and methods for manufacturing the same.

BACKGROUND OF THE INVENTION

Thin film resistors are utilized in electronic circuits in many important technological applications. The resistors may be part of an individual device, or may be part of a complex hybrid circuit or integrated circuit. Some specific examples of thin film resistors in integrated circuits are the resistive ladder network in an analog-to-digital converter, and current limiting and load resistors in emitter follower amplifiers.

Film resistors can comprise a variety of materials including tantalum nitride (TaN), silicon chromium (SiCr), and nickel chromium (NiCr). These resistor materials are generally evaporated or sputtered onto a substrate wafer at a metal interconnect level and subsequently patterned and etched. The thin film resistors require an electrical connection to be made to them and generally the performance of the resistors is related to the condition and cleanliness of the resistor surface and the integrity of the electrical connection. It is well known that contaminants incorporated in the resistor material and around the electrical interconnects can have adverse effects on the resistor performance. It is important to ensure that during the manufacturing process, the resistor surface is not exposed to materials and chemicals likely to leave behind contaminants on the resistor surface that will adversely affect either the bulk sheet resistivity or the subsequent interconnect areas.

A well known method of ensuring that the resistor does not come into contact with potential contaminants during processing is to deposit a sacrificial barrier layer, such as titanium-tungsten (TiW) or other suitable material over the resistor just after it has been deposited. This barrier layer is often referred to as a "hard mask". After the barrier layer and resistor material are patterned and etched, the metal for the metal interconnect is deposited, patterned and etched. The "hard mask" protects the resistor during this processing and is eventually removed by a wet chemical process such as exposure to a hydrogen peroxide ($H_2O_2$) solution just before an insulation layer or passivation layer is deposited over the resistor to permanently protect it.

Maghsoudnia et al (U.S. Pat. No. 5,420,063, issued May 30, 1995) describes the use of the hard mask scheme described above in an embodiment that was designed to allow small line widths to be obtained in the integrated circuit. During processing, the thin film resistor and hard mask are protected by a photoresist layer whilst dry etching is undertaken on the rest of the integrated circuit. Subsequently, when wet etching of the resistor is undertaken, the area previously dry etched is protected by a second photoresist layer.

Linn et al (U.S. Pat. No. 5,547,896, issued Aug. 20, 1996) also describes a method of forming a thin film resistor using a hard mask. Wet etchants are utilized that selectively etch either the hard mask material or the thin film resistor material.

Morris (U.S. Pat. No. 5,485,138, issued Jan. 16, 1996) describes a method of forming an inverted thin film resistor. The resistor structure is deposited directly on top of the metallic interconnects, thus avoiding the need for a protective hard mask.

SUMMARY OF THE INVENTION

Pursuant to the present invention, a thin film resistor is disclosed which is contained between two metal interconnect layers of an integrated circuit. Contact is made to the resistor from vias on the metal layer above the resistor to both the thin film resistor and the underlying metal layer simultaneously. The advantage on this design is that flexibility in processing the resistor is increased since processes, material, and chemicals do not have to satisfy the conditions of both the resistor and the rest of the integrated circuit (especially the interconnect layer) simultaneously.

This and other advantages will be apparent to those of ordinary skill in the art having reference to the specification in conjunction with the drawings.

DETAILED DESCRIPTION OF THE EMBODIMENTS

The following description of the preferred embodiment is merely exemplary in nature and is in no way intended to limit the invention or its application or uses. The present invention discloses a process for manufacturing a thin film resistor in an integrated circuit with the resistor film sandwiched between dielectric layers, which are themselves located between two metal interconnect layers. Contact from the upper metal layer to the resistor and to the lower metal layer may be made simultaneously.

Figure 1:
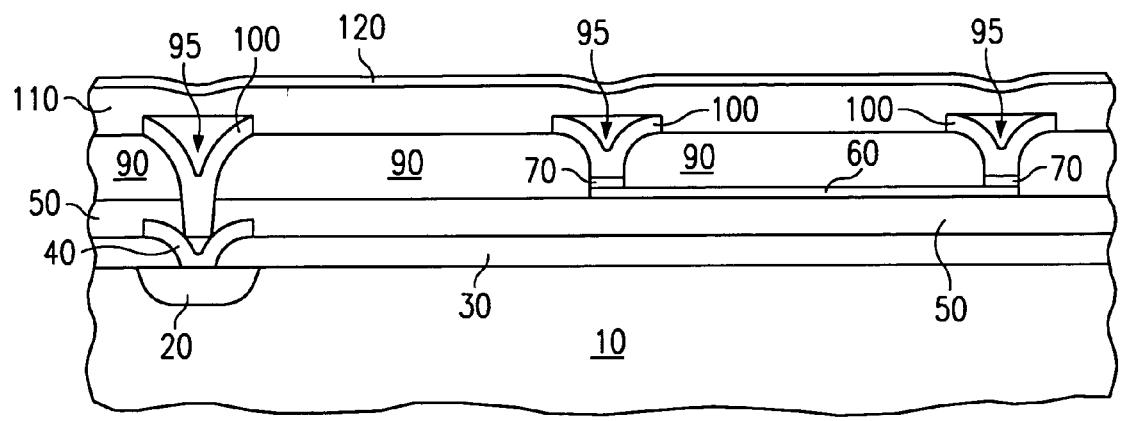
FIG. 1 is a cross-sectional diagram of an integrated circuit having a thin film resistor according to the invention.

A thin film resistor 60 according to the invention is shown in FIG. 1. A first dielectric layer 30 is formed over a semiconductor body 10. Semiconductor body 10 may, for example, comprise a silicon substrate with transistors and other devices formed thereon. A lower metal interconnect layer 40 is shown as contacting a diffused region 20 of semiconductor body 10. The line of metal interconnect layer 40 shown extends into the page. Lower metal interconnect layer 40 typically comprises aluminum. However, other suitable metals are known in the art.

Separating the lower metal interconnect layer 40 and the upper metal interconnect layer 100 is a multi-level dielectric. Two levels 50, 90 are shown. Dielectrics 50 and 90 may, for example, comprise a spin-on-glass. Other suitable dielectrics, such as HSQ, are known in the art. The combined thickness of dielectric 50 and 90 may be chosen according to the requirements for separating the metal interconnect levels 40 and 100 from etch other. The relative thicknesses of layers 50 and 90 can be determined based on optimizing the formation of the multi-level dielectric.

In a preferred embodiment of the invention, the distance from the top of the silicon substrate in semiconductor body 10 to the top of dielectric 50 is chosen such that it's physical thickness multiplied by its refractive index is equal to an odd integer number of laser quarter wavelengths. This optimizes the accuracy of the laser for laser trimming of the resistor after processing. Because the actual thickness of the dielectric varies somewhat, due to deposition errors for example, dielectric 50 may include an additional layer added after measurement of the dielectric thickness as described in co-pending application Ser. No. 09/406,457 (TI-28136), filed Sep. 27, 1999 to Bailey et al and assigned to Texas Instruments Incorporated.

Thin film resistor 60 is sandwiched between dielectrics 50 and 90. Thus, in contrast to the prior art, thin film resistor 60 is located between interconnect levels. Although metal interconnect layer 40 is shown as metal level 1, it may in fact be any metal level except for the topmost metal level. Likewise, although second metal interconnect layer 100 is shown as metal level 2, it may be any metal level other than metal level 1.

Conductively filled vias 95 extend from the upper metal interconnect layer 100 to both resistor 60 and lower metal interconnect layer 40. As discussed further hereinbelow, these vias may be formed simultaneously, with no processing steps being added to contact resistor 60. Vias 95 preferably contact optional portions of hard mask 70 that remain over the ends of resistor material 60. However, vias 95 may contact resistor material 60 and/or hard mask 70. Optional hard mask portions 70 can protect resistor material 60 during the via etch. In this case, hard mask portions 70 comprise a conductive material such as titanium-tungsten (TiW), titanium-nitride (TiN), or molybendum (Mo). Resistor material 60 typically comprises a material such as tantalum-nitride (TaN), silicon-chromium (SiCr), or nickel chromium (NiCr). Resistor material 60 may be, for example, 50–2000 Å, while hard mask 70 may, for example, be 500–3000 Å.

Figure 2:
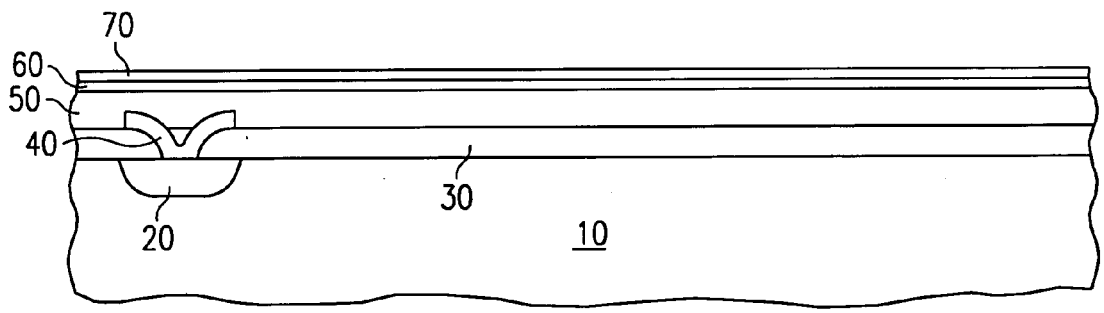
FIGS. 2–8 are cross-sectional diagrams of the integrated circuit of FIG. 1 at various stages of fabrication.

A method for forming thin film resistor 60 according to the invention will now be discussed with reference to FIGS. 2–7. Referring to FIG. 2, a semiconductor body 10 is provided having an active region 20 formed therein. Active region 20 may, for example, be a N-type of P-type diffusion region of a transistor. Semiconductor body 10 is typically a silicon substrate processed through the formation of isolation structures, transistors, and other devices (all not shown). Deposited over semiconductor body 10 is a dielectric layer 30. Next, a lower metal interconnect layer 40 is formed. Lower metal interconnect layer 40 may, for example, comprise aluminum. Methods for forming metal interconnect layers are well known in the art.

Dielectric layer 50 is formed next. Dielectric layer 50 may be the first layer of a multi-layer dielectric. Dielectric layer 50 is preferably a planarized layer and may be formed in any of a number of ways. Some examples include: deposition followed by CMP (chemical-mechanical-polishing), resist etch back, deposition of a flowable oxide such as HSQ, dep-etch-dep, deposition of a spin-on-glass (SOG) and etch-back. Dielectric 50 may be any planarized dielectric suitable for interlevel dielectric layers, such as SOG, BPSG, PSG, USG and HSQ.

After dielectric 50 has been formed, a layer of resistor material 60 is deposited. Suitable materials for resistor material 60 are known in the art, such as TaN, SiCr, or NiCr. As an example, sputter deposition may be used. Resistor material 60 may be, for example, 50–2000 Å thick. Next, a hard mask 70 is deposited over resistor material 60. The function of hard mask 70 is to protect resistor material 60 from contaminants during subsequent processing. Suitable materials include TiW, TiN, and Mo. The thickness of hard mask 70 may be, for example, 500–3000 Å.

Figure 3:
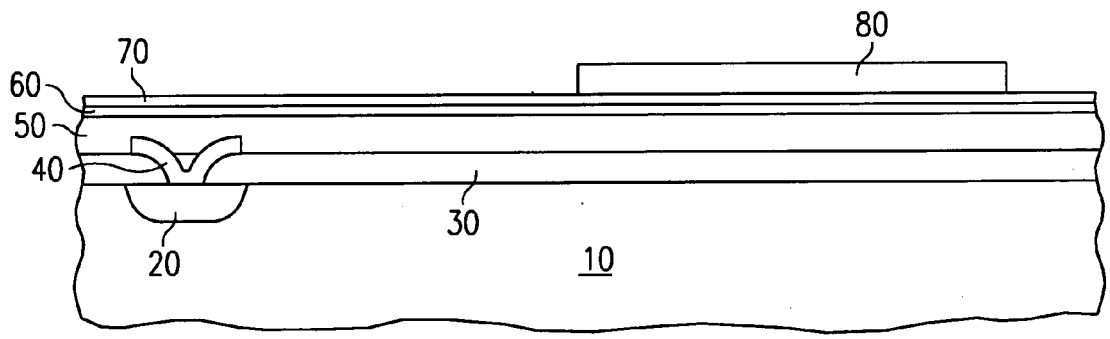
Figure 4:
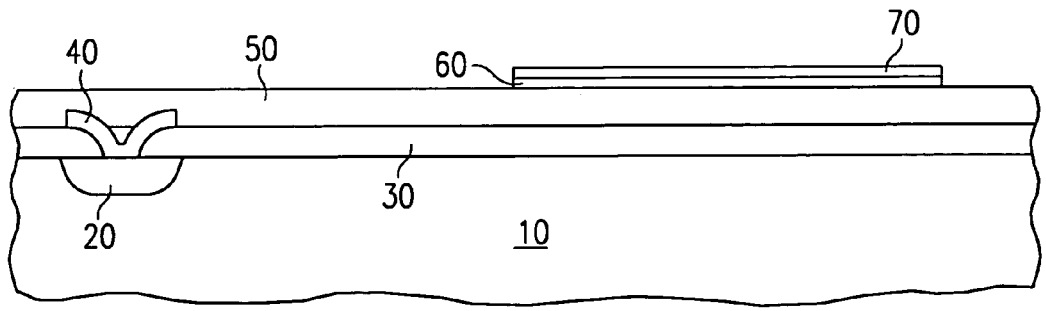

Referring to FIG. 3, a photoresist mask 80 is formed over hard mask 70. Photoresist mask 80 masks those portions of resistor material 60 that will become the thin film resistor. The exposed portions of hard mask 70 and resistor material 60 are then removed using a suitable etchant or combination of wet and dry etchants. Suitable wet etchants for NiCr, such as ceric sulphate, are known in the art. Photoresist mask 80 is then stripped as shown in FIG. 4.

Figure 5:
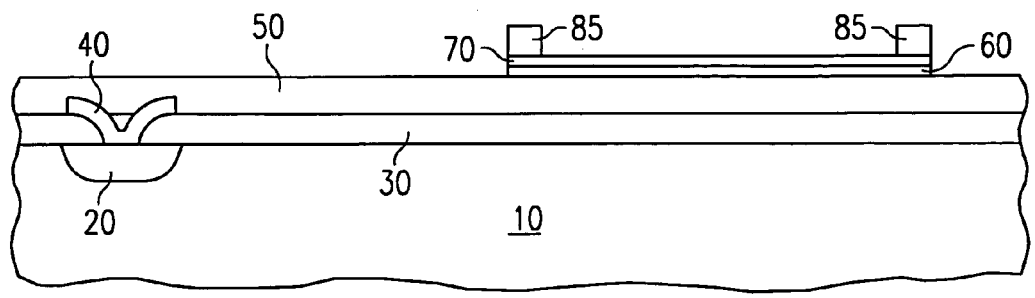
Figure 6:
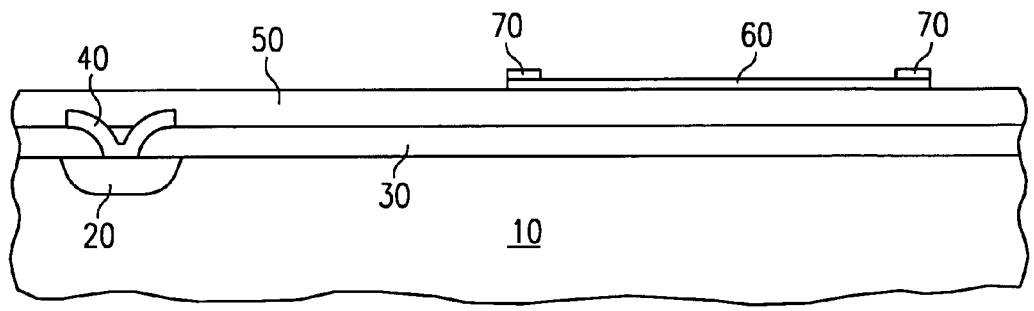

If it is desired to leave portions of hard mask 70 over areas where interconnect to resistor 60 is to be made (i.e., at the ends of resistor material 60), a second photoresist mask 85 is formed to produce patterns over the edges of the resistor 60, as shown in FIG. 5. The exposed portions of hard mask 70 are hen removed with a suitable etchant that does not adversely affect the thin film resistor material 60, as shown in FIG. 6. In the case of a TiW hard mask 70, a suitable etch is a solution of hydrogen peroxide ($H_2O_2$). Photoresist mask 85 is then stripped. Leaving portions of hard mask 70 in this manner is preferred, but optional. The remaining portions of hard mask 70 will protect resistor material 60 during the subsequent via etch.

Figure 7:
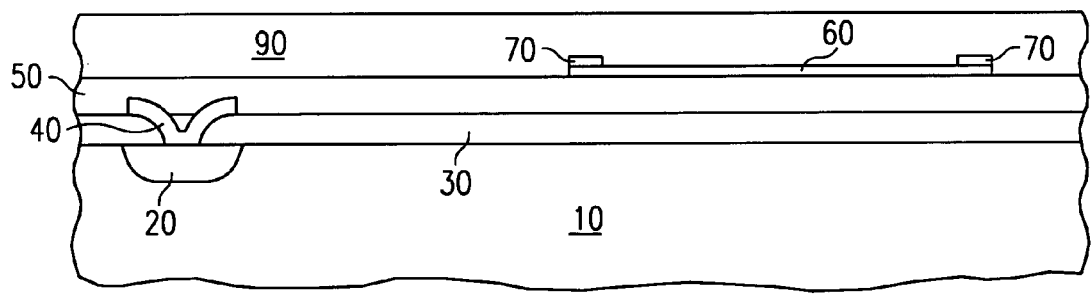

Referring to FIG. 7, the remaining portion of the multi-level dielectric layer, dielectric 90, is formed. Dielectric 90 is formed over dielectric 50, resistor material 60, and any remaining portions of hard mask 70. Dielectric 90 may comprise a range of materials including, but not limited to, silica, silicate glasses, and spin on glasses (USG, PSG, BPSG, HSQ, SOG, etc.).

Figure 8:
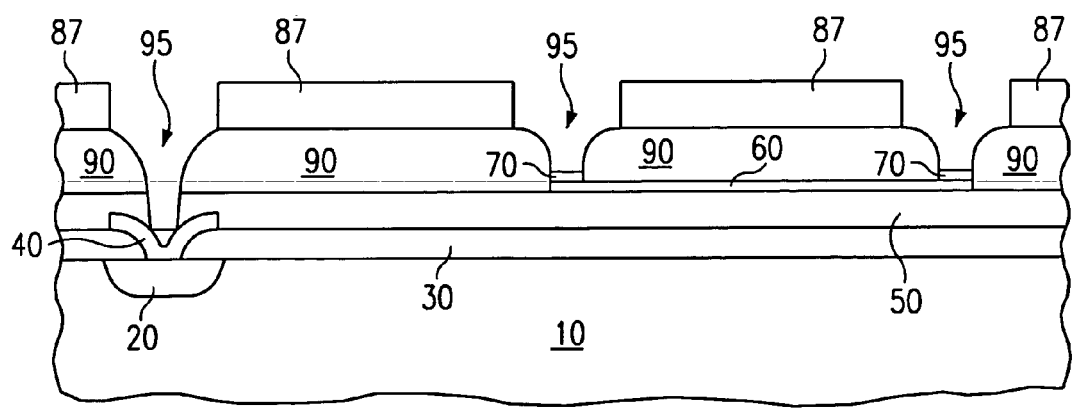

Next, vias 95 are formed in dielectric 90 and dielectric 50 using a pattern 87 and etch, as shown in FIG. 8. Vias 95 extend through dielectric 90 to hard mask 70 (or resistor material 60 if hard mask portions do not remain) and through both dielectric 50 and 90 to the lower metal interconnect layer 40. All vias 95 may be formed during the same patterned etch step, so no additional steps are needed to connect to the resistor 60. Alternatively, vias 95 to the lower interconnect layer 40 and vias 95 to the resistor 60 may be formed separately. The upper metal interconnect layer 100 is formed and the vias 95 are filled with conductive material. Finally, dielectric layer 110 and passivation layer 120 are deposited over the device, resulting in the structure shown in FIG. 1.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a lower metal interconnect layer located over a semiconductor body;
   a multi-level dielectric layer located over said lower interconnect layer;
   an upper metal interconnect layer located over said multi-level dielectric layer;
   a thin film resistor embedded within said multi-level dielectric layer between said lower metal interconnect layer and said upper metal interconnect layer, wherein said thin film resistor comprises a resistor layer that is physically separated, in its entirety, in a vertical direction from any metal interconnect layer;

a first via extending from said upper metal interconnect layer to said lower interconnect layer; and a second via extending from said upper metal layer to said thin film resistor.

2. The integrated circuit of claim 1, wherein said thin film resistor comprises a hard mask located over an end of the thin film resistor.

3. The integrated circuit of claim 1, wherein said thin film resistor comprises TaN.

4. The integrated circuit of claim 1, wherein said thin film resistor comprises SiCr.

5. The integrated circuit of claim 1, wherein said thin film resistor comprises NiCr.

6. An integrated circuit comprising:

a lower metal interconnect layer located over a semiconductor body;

a multi-level dielectric layer located over said lower interconnect layer;

an upper metal interconnect layer located over said multi-level dielectric layer; and a thin film resistor embedded within said multi-level dielectric layer between said lower metal interconnect layer and said upper metal interconnect layer, wherein said thin film resistor comprises a resistor layer that is physically separated, in its entirety, in a vertical direction from any metal interconnect layer, wherein said thin film resistor comprises a hard mask located over an end of the thin film resistor, and wherein said hard mask comprises TiW.

7. An integrated circuit comprising:

a lower metal interconnect layer located over a semiconductor body;

a multi-level dielectric layer located over said lower interconnect layer;

an upper metal interconnect layer located over said multi-level dielectric layer; and a thin film resistor embedded within said multi-level dielectric layer between said lower metal interconnect layer and said upper metal interconnect layer, wherein said thin film resistor comprises a resistor layer that is physically separated, in its entirety, in a vertical direction from any metal interconnect layer, wherein said thin film resistor comprises a hard mask located over an end of the thin film resistor, and wherein said hard mask comprises TiN.

* * * * *